(12) United States Patent
Maeda et al.

(10) Patent No.: US 7,078,330 B2
(45) Date of Patent: Jul. 18, 2006

(54) METAL ELECTRODE AND BONDING METHOD USING THE METAL ELECTRODE

(75) Inventors: Akira Maeda, Tokyo (JP); Takeyuki Maegawa, Tokyo (JP); Shigeru Matsuno, Tokyo (JP); Takuo Ozawa, Tokyo (JP); Takanori Sone, Tokyo (JP); Shoji Miyashita, Tokyo (JP); Yasumichi Hatanaka, Tokyo (JP); Masato Koyama, Tokyo (JP); Takahiro Nagamine, Tokyo (JP); Susumu Arai, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/790,757

(22) Filed: Mar. 3, 2004

(65) Prior Publication Data

US 2004/0175917 A1 Sep. 9, 2004

(30) Foreign Application Priority Data

Mar. 5, 2003 (JP) ............................. 2003-058249
Oct. 17, 2003 (JP) ............................. 2003-357591

(51) Int. Cl.
*H01L 21/44* (2006.01)

(52) U.S. Cl. ...................... 438/612; 438/613; 438/614; 438/615

(58) Field of Classification Search ................ 257/750, 257/751, 779, 781; 438/612, 613, 614, 615
See application file for complete search history.

(56) References Cited

U.S. PATENT DOCUMENTS

| 5,611,481 | A  | * | 3/1997 | Akamatsu et al. ...... 228/180.22 |
| 5,808,853 | A  |   | 9/1998 | Dalal et al. |
| 6,550,665 | B1 | * | 4/2003 | Parrish et al. ......... 228/180.22 |
| 6,569,752 | B1 | * | 5/2003 | Homma et al. ............. 438/597 |
| 6,818,996 | B1 | * | 11/2004 | Mertol et al. ............... 257/773 |
| 6,882,045 | B1 | * | 4/2005 | Massingill et al. ......... 257/724 |

OTHER PUBLICATIONS

W. So et al., "High Temperature Joints Manufactured at Low Temperature", *IEEE, Electronic Components and Technology Conference*, 1998, pp. 284-291, California.

* cited by examiner

*Primary Examiner*—Zandra V. Smith
*Assistant Examiner*—Christy Novacek
(74) *Attorney, Agent, or Firm*—Leydig, Voit & Mayer, Ltd.

(57) ABSTRACT

A metal electrode is formed on a substrate. The metal electrode includes a first layer, a second layer, and a third layer lying, from an outermost surface of the metal electrode toward the substrate, in this order. The first layer contains tin as a principal constituent and the second layer contains a metallic element which produces an eutectic reaction with tin, wherein the melting point of the first layer is higher than the melting point of the second layer. The third layer is an underlying metallic layer for the first and second layers.

1 Claim, 3 Drawing Sheets

METAL ELECTRODE AND BONDING METHOD USING THE METAL ELECTRODE

BACKGROUND OF THE INVENTION

1. Field of the Invention

The present invention relates to a metal electrode which serves as a connecting terminal, or pin, of a semiconductor device or other electronic components and a method of joining the metal electrode to a circuit card. More particularly, the invention pertains to a metal electrode for bonding multiple semiconductor devices, multiple electronic components, or a semiconductor device and an electronic component, as well as to a method of joining a metal electrode to a circuit card.

2. Description of the Background Art

With a growing demand for increased data transmission rate today, there is a pressing need for developing microjoining technology to cope with an ever continuing move toward a further reduction in the size of electronic components and a finer pitch arrangement of their connecting pins.

Also, due to today's prevailing tendency toward low-cost products, temperature limits of heat resistance of electronic components continues to lower these days. Thus, there is a strong need today to decrease bonding temperature at which metal electrodes of electronic components are joined to a circuit card to prevent damages to the electronic components. Furthermore, it is highly needed to lower the bonding temperature to diminish warp and twist of joined elements.

Another ongoing trend in semiconductor technology is an increase in the number of connecting pins and a consequent finer pitch pin arrangement to implement as many functions and as high performance as possible in a single semiconductor device without increasing the chip size. In this situation, greater quantities of solder than actually needed have so far been supplied to joints in order to absorb variations in the height of individual electrodes and to facilitate intrusion of resin which is later supplied for strengthening the joints, for instance.

Under these circumstances, prior art (e.g., Japanese Examined Patent Publication No. 3024097) discloses a method of joining metal electrodes. According to the Publication, a metal electrode has a structure in which a high melting point solder ball is attached to a wiring, and a layer of low melting point metal which produces an eutectic reaction with the high melting point solder is formed on the surface of the solder ball. In this method of metal electrode joining, the solder ball is heated to a temperature equal to or higher than the eutectic point of the low melting point metal and high melting point solder but lower than the melting point of the high melting point solder without melting a portion of the solder ball close to but not in contact with the wiring to thereby join the metal electrode to the wiring at a relatively low temperature with a reduced amount of molten metal.

Another prior art document (Proceedings of the 1998 Electronic and Technology Conference, USA, pp. 284–291) discloses an electrode structure, in which the surface of a metal electrode is coated with the same metallic element as a circuit card to which the metal electrode is joined. This electrode structure is so designed that the metal electrode can be joined to the circuit card at as low a melting point as possible forming a layer of a compound of the coated metallic element and material of the metal electrode having a high remelting temperature between the metal electrode and the circuit card. This non-patent prior art document discloses an exemplary electrode structure, in which copper (Cu) forming a circuit card is evaporated onto a tin (Sn) layer covering the surface of an electrode so that a layer of $Cu_6Sn_5$ is formed as a result of bonding.

A conventionally known approach to mount a semiconductor device on a circuit card is flip-chip bonding. According to this approach, a resin containing a reducing material is preapplied around electrodes and, after bringing electrode surfaces of the semiconductor device and the wiring board into mutual contact by simultaneously applying heat and pressure thereby purging the resin of a gel form from the contact surfaces, the semiconductor device is joined to the wiring board by almost simultaneous melt bonding and resin hardening while removing a oxide film formed on a solder surface with the aid of the reducing material. In this bonding method, it is essential that the resin of the gel form be removed from around the electrodes of the semiconductor device and the circuit card to allow their direct contact before the electrode surfaces are melted.

According to the method described in the aforementioned Japanese Examined Patent Publication No. 3024097, however, the low melting point metal exists on the surface of the solder ball, so that viscosity of the molten low melting point metal of the solder ball is lower than the resin. This poses a problem that the molten low melting point metal of the solder ball can not thoroughly remove the resin from the contact surfaces but rather mixes with the resin during bonding process, resulting in a high risk of bonding defects and deterioration of joint reliability.

The deterioration of joint reliability will become progressively more conspicuous with the lapse of time that joints are exposed to room temperature after their formation. Thus, the aforementioned conventional approach lacks in long-term service life (reliability) of the joint.

According to the aforementioned non-patent prior art document, the melting point of the outermost $Cu_6Sn_5$ layer of the electrode is estimated at 415° C. which is higher than the melting point of the underlying Sn layer. However, the eutectic temperature of $Cu_6Sn_5$ and Sn is 227° C., so that the joining temperature exceeds the melting temperatures of currently available solders (e.g., 183° C. for Sn-37Pb solder and 221° C. for Sn-3.5Ag solder).

The aforementioned intermetallic compound $Cu_6Sn_5$ has a hardness of 76 on the Knoop scale (Bulletin of the Japan Electronic Materials Society, 1984, Vol. 16, p. 30). Since $Cu_6Sn_5$ is considerably harder than Sn of which hardness is 7, a large load is needed to bring the entire surface of electrodes of a semiconductor device into contact with corresponding electrodes of a wiring board, particularly in the case of a semiconductor device having a large number of pins.

Furthermore, since $Cu_6Sn_5$ is chemically so stable that it takes a long time to remove an oxide film, causing an increased risk of greater warpage, component damages by heat and deterioration of joint reliability.

SUMMARY OF THE INVENTION

This invention is intended to solve the aforementioned problems of the prior art. Accordingly, it is an object of the invention to provide a metal electrode and a method of joining the metal electrode to a circuit card which enable joining at a low temperature and with a reduced amount of molten metal and a small load, thereby offering an extended service life of a joint.

According to the invention, a metal electrode including multiple metallic layers is built on a wire formed on a substrate, the metallic layers including at least a first layer and a second layer lying from an outermost surface of the metal electrode toward the substrate in this order. The first layer contains tin as a principal constituent, the second layer contains a metallic element which produces an eutectic reaction with tin, and the melting point of the first layer is higher than that of the second layer.

The metal electrode thus structured can be joined to a circuit card at a low temperature and with a reduced amount of molten metal and a small load. A joint produced by use of the metal electrode of the invention offers an extended period of useful life.

These and other objects, features and advantages of the invention will become more apparent upon reading the following detailed description along with the accompanying drawings.

DETAILED DESCRIPTION OF THE PREFERRED EMBODIMENTS OF THE INVENTION

First Embodiment

Figure 1A:
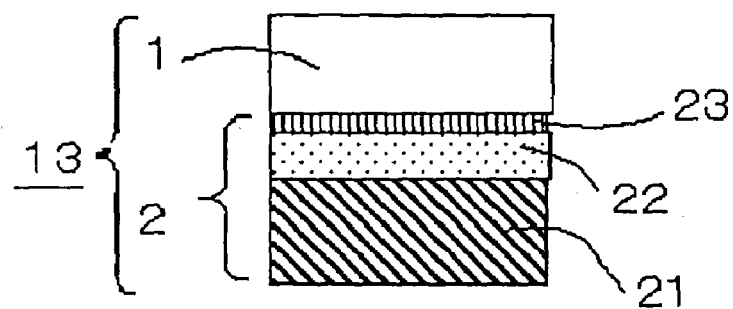
FIGS. 1A and 1B are sectional diagrams illustrating a process of joining a semiconductor device having a metal electrode to an electronic circuit card according to a first embodiment of the invention.
Figure 1A:
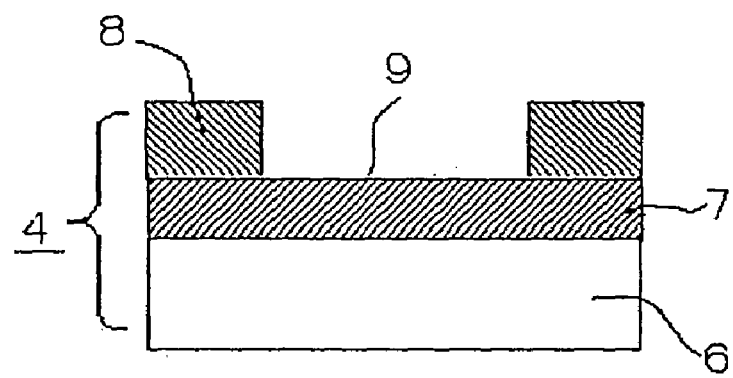
Figure 1A:
Figure 1B:
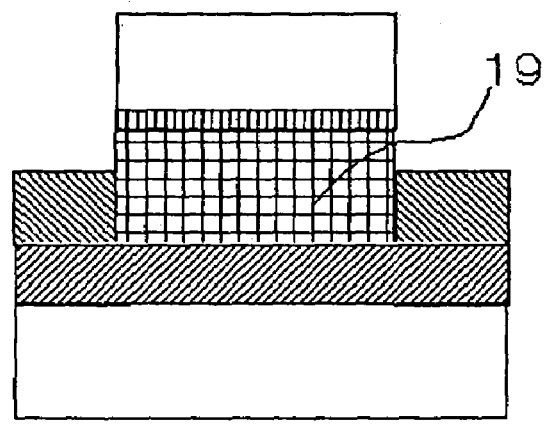

FIGS. 1A and 1B are sectional diagrams illustrating a process of joining a metal electrode 2 to a circuit card 4 according to a first embodiment of the invention, in which the metal electrode 2 serving as a connecting pin is formed on a wiring which is formed on a substrate 1. Of these Figures, FIG. 1A shows a state before the metal electrode 2 is joined to the circuit card 4 and FIG. 1B shows a state after the metal electrode 2 has been joined to the circuit card 4.

The metal electrode 2 joined to the substrate 1 includes a first metallic layer 21, a second metallic layer 22 and a third metallic layer 23 lying from the bottom toward the substrate 1 in this order. The first metallic layer 21 contains tin (Sn) as its principal constituent, the second metallic layer 22 contains a metallic element which produces an eutectic reaction with Sn, and the third metallic layer 23 is an underlying electrode layer. The first metallic layer 21 has a higher melting point than the second metallic layer 22.

The circuit card 4 includes a carrier base 6 containing as its principal constituent silicon (Si) or an organic material and a wiring layer 7 containing as its principal constituent aluminum (Al) or copper (Cu) formed on top of the carrier base 6. The top of the wiring layer 7 is partly exposed by forming an electrode opening 9 of a particular shape at a specific position in an organic coating 8 made of a resist (solder mask), for example. The top surface of the electrode opening 9 is covered with a conductor film formed by applying flux, plating with solder, or with a Ni film or an Au film formed by depositing nickel (Ni) or gold (Au) by electroplating or electroless plating.

A joint surface (i.e., the wiring layer 7 of FIG. 1A) of the circuit card 4 to which the metal electrode 2 is connected may be formed of any element diffusible with Sn.

A semiconductor substrate and an organic substrate, such as a polymer film, are examples of the substrate 1 on which the metal electrode 2 of this embodiment is formed. If the substrate 1 is a semiconductor substrate, the aforementioned metal electrode 2 is used for joining a semiconductor device 13 to the circuit card 4. If the substrate 1 is a polymer film, the metal electrode 2 is used for joining an electronic device 13, such as a film carrying a conductor pattern used in a mobile telephone, to the circuit card 4. Also, if the circuit card 4 is a semiconductor device or an electronic device, the metal electrode 2 serves to join multiple semiconductor devices or multiple electronic devices to each other, or a semiconductor device to an electronic device.

Figure 2A:
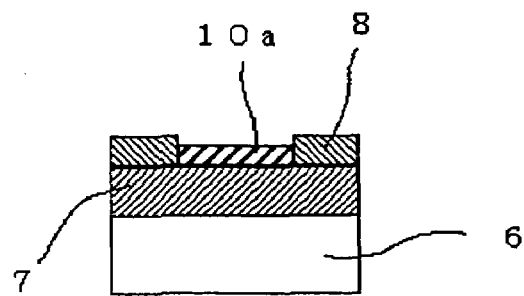
FIGS. 2A and 2B are sectional diagrams showing specific structures of the electronic circuit card of FIGS. 1A and 1B.
Figure 2B:
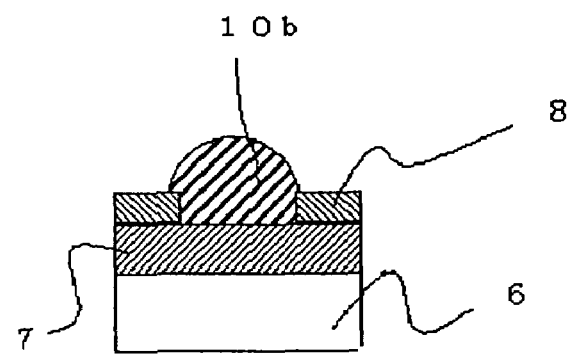

FIGS. 2A and 2B are sectional diagrams showing specific structures of the circuit card 4. Shown in FIG. 2A is an example in which the top surface of the electrode opening 9 is covered with a metallic layer 10a including a nickel-phosphorus (Ni—P) layer measuring about 5 μm thick deposited by electroless plating and an Au layer measuring about 0.05 μm thick deposited on top of the Ni—P layer by electroless plating such that the thickness of the metallic layer 10a does not exceed the height of the organic coating 8. Shown in FIG. 2B is an example in which an electrode 10b is formed on the top surface of the electrode opening 9 to a height equal to or larger than the height of the organic coating 8 by screen-printing solder paste or by dipping the circuit card 4 in a solder bath.

Since the first layer 21 of the metal electrode 2 of this embodiment contains Sn as its principal constituent, SnO/$SnO_2$ becomes dominant in its outermost oxide film. It is possible to use a conventional method (such as use of flux, scrubbing, heating in a reducing atmosphere or heating in contact with a resin containing a reducing material) for removing this oxide film. The oxide film can be removed so easily and securely in this way that it is possible to prevent formation of voids due to insufficient removal of the oxide film and a faulty joint, ensuring highly reliable bonding. It is needless to say that a joint 19 thus produced offers a long-term service life (reliability).

Since the second layer 22 contains a metallic element which produces an eutectic reaction with Sn of the first layer 21, it is possible to join these layers at a low temperature. The chemical composition of the joint 19 can be controlled by the compositions and thicknesses of the first and second layers 21, 22, whereby the amount of molten metal in bonding process can be regulated. This permits a significant reduction in the risk of contact (solder bridging) between the joint 19 and an adjacent metal electrode, making it possible to produce a highly reliable joint.

Furthermore, since the first layer 21 has a higher melting point than the second layer 22, a longer time is required for the first layer 21 to melt when the device 13 is joined by use of a resin containing a reducing material. Thus, the outermost surface (bottom as illustrated) of the metal electrode 2 can be brought into contact with the joint surface (top as illustrated) of the circuit card 4 before the viscosity of a molten portion of the metal electrode 2 decreases too much. This makes it possible to prevent formation of a faulty joint due to mixing of the resin into the molten metal and thereby produce a highly reliable joint.

Although a slightly longer period of time is required for joining the metal electrode 2 to the circuit card 4 when the melting point of the first layer 21 is made higher than that of the second layer 22, this produces no problem at all in industrial applications as the difference in the duration of bonding process is approximately a few seconds to a few tens of seconds only.

Since oxidization of the metal electrode 2 potentially caused by exposure of a low melting point metallic element on its outer walls is avoided in the above-described electrode structure of the embodiment, the joint 19 offers a long-term service life (reliability). Furthermore, the embodiment has such advantageous effects that it enables satisfactory joining at low temperatures and reduces the risk of void formation during electrode-to-electrode bonding as well as the risk of contact (solder bridging) between adjacent metal electrodes.

The same advantageous effects would also be obtained when a layer of metal, such as Ni, Cu, chromium (Cr) or titanium (Ti), having a melting point higher than that of the first layer 21 is provided as a bimetal or as an underlying layer 23 for height adjustment, for instance, between the second layer 22 and the substrate 1 in a similar fashion to the aforementioned metal electrode 2 of the embodiment.

Second Embodiment

It is preferable that the second layer 22 of the metal electrode 2 of the first embodiment contain indium (In). For this purpose, established film forming processes, such as spattering and plating, are available for depositing In. Compared to Sn having a Brinell hardness of 5.3, In has a Brinell hardness of 0.9 (Metals Data Book, third edition, fourth print, published by Maruzen Co., Ltd., Apr. 10, 1997, p. 165). Since In is so soft that it would easily plastically deform under a relatively small load. Therefore, particularly when a large number of electrodes are joined to corresponding electrodes at the same time, provision of an In layer helps reduce the amount of load necessary for bringing all the electrodes into contact with the corresponding electrodes. If the second layer 22 is entirely formed of In alone, the aforementioned effect would become even more conspicuous.

The inventors performed experimental tests in which chip devices each having a 40 μm metallic layer formed by electroplating In, bismuth (Bi), Cu, silver (Ag), Au or Ni on a substrate of a metal electrode, instead of the metal electrode 2 shown in FIG. 1A, were aligned with and joined to electrode openings each having a diameter of 150 μm formed in an electronic circuit card by use of a flip chip bonder. Prior to the bonding process, the top surface of the electrode opening was precoated with Sn-3.0Ag-0.5Cu (% by weight) solder to a thickness of about 50 μm by dipping in a solder bath. Test results indicate that, among the chip devices coated with the aforementioned metals, the one having the metal electrode covered with the In layer can be joined at the lowest temperature and with the smallest load.

Since In produces an eutectic reaction with Sn at about 120° C. as a result of their interdiffusion, a layer containing Sn as its principal constituent can be melted at a temperature lower than the melting point Sn. Furthermore, among those elements which produce an eutectic reaction through interdiffusion with Sn, In is a metal having relatively low toxicity and is environmentally friendly.

Moreover, In interdiffuses with other high melting point metals, such as Au, Ni, Cu and Ag, and lowers their melting points in a relatively short period of time. Therefore, the second layer 22 containing In serves to join the metal electrode 2 to the electrode opening 9 easily and securely when the joint surface of the circuit card 4 bonded to the metal electrode 2 is formed of one of the aforementioned high melting point metals.

It is to be pointed out, however, that from the viewpoint of product cost and remelting temperature the content of In in the second layer 22 should preferably be equal to or less than 10% by weight relative to the amount of metal which produces an eutectic reaction with In.

Third Embodiment

Figure 3:
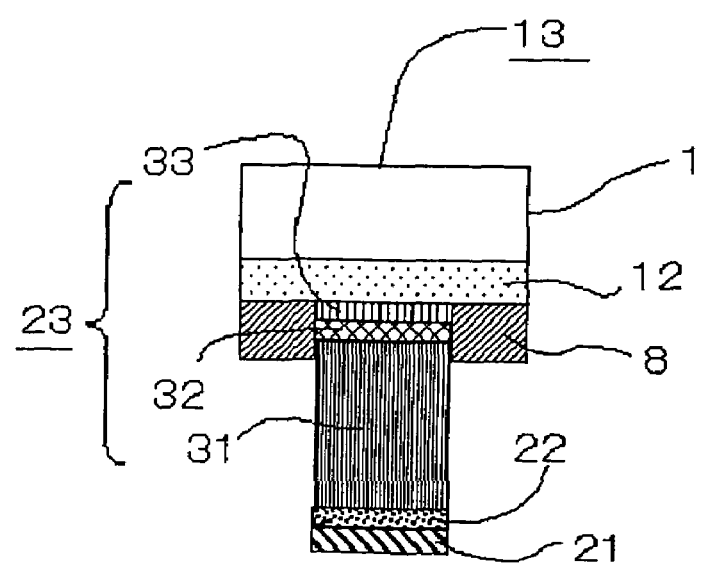
FIG. 3 is a sectional diagram of a semiconductor device having a metal electrode according to a third embodiment of the invention.

FIG. 3 is a sectional diagram of a semiconductor device 13 having a metal electrode according to a third embodiment of the invention, particularly showing its electrode structure.

As depicted in FIG. 3, the semiconductor device 13 includes a wiring layer 12 containing Al as its principal constituent formed immediately on the bottom of a substrate 1. The metal electrode includes a fifth layer 33, a fourth layer 32, a third layer 31, a second layer 22 and a first layer 21 lying from the bottom of the metal electrode toward the substrate 1 in this order.

The first and second layers 21, 22 are essentially identical to those described in the first embodiment. The third to fifth layers 31–33 lying one on top of another together constitute an underlying metallic layer 23, in which the third layer 31 is a metallic layer containing Cu as a principal constituent, the fourth layer 32 is a metallic layer containing Au as a principal constituent, and the fifth layer 33 is a metallic layer containing Ni as a principal constituent. The underlying layer 23 enables bimetal formation or electrode height adjustment.

Generally, if electrodes are formed by an electroplating process, there occur variations in the height and chemical composition of the electrodes since electrode-forming metals are electrically deposited. More specifically, such variations occur due to differences in the shape and size of electrode openings or due to differences in current densities between different locations of a wafer, such as between central and peripheral portions of the wafer.

An electroless plating process, if used to solve this problem in electrode forming, would pose another problem. Specifically, the electroless plating process is associated with a phenomenon that it can deposit a particular metal on one metal but not on another metal at different deposition potentials and, therefore, it is difficult to form metallic films to increased thicknesses.

The electrode structure of the third embodiment shown in FIG. 3 makes it possible to produce a metal electrode having a desired configuration by an electroless plating process.

According to today's technological mainstream, the wiring layer 12 formed on the bottom of the substrate 1 is made of a substance containing Al as its principal constituent, such as Al—Cu, Al—Si, Al—Si—Cu.

From experimental testing, the inventors have verified that although a metallic film containing In or Sn as a principal constituent can be formed relatively easily on the surface of a Cu layer by the electroless plating process, it is not possible to deposit a satisfactory film of Cu, Au, Sn or In on a wiring layer containing Al as a principal constituent. Test results indicate that it is most effectively to form a film containing Ni as a principal constituent (i.e., the fifth layer 33 of FIG. 3) having a relatively low depositing speed on a wiring layer containing Al as a principal constituent to produce an electrode having a necessary height by the electroless plating process. Examples of material of this kind of film are Ni—P and Ni-boron (B) containing a reducing substance of a plating solution.

Then, the inventors have verified that a film containing Cu, Sn or In can not be deposited on a film (i.e., the fifth layer 33 of FIG. 3) containing Ni as a principal constituent by the electroless plating process and found that it is necessary to deposit a film containing Au as a principal constituent on the film containing Ni as a principal constituent (i.e., the fourth layer 32 of FIG. 3).

Further, the inventors have verified that a film containing Sn or In can not be deposited on the film containing Au as a principal constituent by the electroless plating process and it is difficult to deposit a satisfactory film containing Sn or In on other than a Cu film and found that it is necessary to deposit a film containing Cu as a principal constituent (i.e., the third layer 31 of FIG. 3) on the film containing Au as a principal constituent.

It is possible to form the second layer 22 and the first layer 21 of the metal electrode of the third embodiment shown in FIG. 3 in the aforementioned manner. Since the metal electrodes formed by the electroless plating process exhibit only small variations in shape and composition, it is possible to join the metal electrodes to a circuit card with high reliability.

Fourth Embodiment

In a fourth embodiment of the invention described below, one of the metal electrodes according to the first to third embodiments is brought into contact with a circuit card and their joint surfaces are heated at a temperature equal to or higher than the lowest one of temperatures at which eutectic reaction occurs between the first layer 21 and the second layer 22 but lower than the melting point of the outermost surface (bottom side as illustrated) of the first layer 21. Here, the joint surface of the circuit card is made of a material which can join with Sn when heated.

The aforementioned heating temperature is made equal to or higher than the temperature at which the eutectic temperature occurs to join the metal electrode to the circuit card under low-load conditions while keeping the metal electrode in a liquid phase. If the metal electrode is bonded to the circuit card in a solid phase, it is necessary to apply a large load to break up oxide films formed on their joint surfaces, causing increased risk of damaging a semiconductor device or other type of electronic device, whichever applicable. Unless the metal electrode is bonded in the liquid phase, it will be difficult to successfully apply the invention especially if the device is of a type having a large number of pins.

Reasons why the aforementioned heating temperature is made lower than the melting point of the outermost surface of the first layer 21 are as follows. Specifically, the heating temperature lower than the melting point of the outermost surface of the first layer 21 helps reduce the volume of a molten portion of the metal electrode, resulting in a reduced risk of contact (solder bridging) between adjacent electrodes. Since the bonding temperature decreases in the aforementioned approach the present embodiment, it is possible to reduce the amount of warpage of elements formed of materials having different coefficients of thermal expansion as well as the risk of damages to components formed of polymers, for instance, having low temperature limits of heat resistance. This eventually serves to offer improved long-term joint reliability.

The present embodiment described above makes it possible to produce a satisfactory metal joint with least formation of voids and minimized mixing of the oxide film, thereby offering enhanced long-term joint reliability.

Moreover, the joint with reduced warpage of surrounding elements is subjected to a reduced stress, so that the aforementioned arrangement of the embodiment is advantageous in ensuring long-term joint reliability.

To give a specific example, the aforementioned structure of the present embodiment is applicable to a mobile telephone, in which an electronic component using an organic substrate (made of an organic material) is electrically joined to another electronic component like a film carrying a conductor pattern using an organic film as a substrate. Problems usually encountered when joining these electronic components are as follows. The higher the bonding temperature, the more thermally expands the organic substrate, causing deterioration in positioning accuracy of electrodes on the organic substrate with electrodes on the organic film. Also, the greater the amount of molten solder, the more increases the risk of contact (solder bridging) of adjacent electrodes with each other. In addition, the larger the load applied during a bonding process, the more likely a reduction in joint reliability of or damages to electronic components already mounted on a reverse side of the organic substrate could occur. Despite such general tendency, the structure of the fourth embodiment have such advantageous effects that component damages and deterioration of quality which could occur when electrodes made of different materials are joined together can be reduced. This is because the electrodes of the present embodiment are joined at lower temperatures compared to conventionally used bonding temperatures.

EXAMPLES

The invention is now discussed with reference to evaluation tests conducted on specific examples of implementation thereof and their comparative examples. Terminology used for identifying specimens for testing as well as evaluation criteria are explained at first.

Cu Chip

An assembly including a small piece of Cu plate measuring 5 mm square wide and 0.25 mm thick which represents a combination of a substrate and a wiring layer and metallic layers corresponding to the first and second layers 21, 22 of the metal electrode of the foregoing embodiments formed on the bottom of the Cu plate is hereinafter referred to as a Cu chip.

Cu Card

An assembly including a small piece of Cu plate measuring 10 mm square wide and 0.25 mm thick which serves as a circuit card, a 5 μm thick Ni—P layer formed on the bottom of the Cu plate by electroless plating, and a 0.05 μm thick Au layer formed on the bottom of the Ni—P layer by electroless plating is hereinafter referred to as a Cu card. The Cu card corresponds to the circuit card to which the metal electrode according to the foregoing embodiments is joined.

Si Chip

An assembly including a Si card measuring 5 mm square wide and 500 μm thick which serves as a substrate carrying as wiring layers a 1 μm thick Al layer, a 0.02 μm thick Cr layer and a 0.03 μm thick Cu layer formed on the bottom of the Si card in this order by spattering as well as metallic layers corresponding to the first and second layers 21, 22 of the metal electrode of the foregoing embodiments formed on the bottom of the Cu layer is hereinafter referred to as a Si chip.

TEG Chip

One of dice produced by dicing a test element group (TEG) wafer which has test patterns including a metal electrode corresponding to the metal electrode of the foregoing embodiments is hereinafter referred to as a TEG chip. While the TEG chip thus produced measures 10 mm square and contains a test pattern, its electrode-to-electrode intervals are close to those of an actual chip device. Compared to the aforementioned Cu chip or Si chip of which metal electrode is formed directly on the Cu plate or the Si card, the TEG chip can be regarded as being more closely similar to an actual chip device.

TEG Card

Each of the dice produced by dicing the aforementioned TEG wafer to 20 mm square pieces is hereinafter referred to as a TEG card. The TEG card thus produced corresponds to the circuit card to which the metal electrode according to the foregoing embodiments is joined.

Bonding Process

The individual chips were joined to the cards by use of a double hot plate set to appropriate temperatures. A load was applied to a central portion of each chip from top using a push gage as necessary. Also, a flux (type RM26 manufactured by Tamura Kaken Corporation, Japan) or a resin containing a reducing material (NUF series manufactured by Nitto Denko Corporation, Japan) was used as necessary.

Method of Evaluating Joint Quality

Test samples each carrying a metal electrode joined by the aforementioned bonding process were embedded in resin. Each sample was vertically cut approximately along its central axis and a cut surface was polished and examined by using a scanning electron microscope.

Results of examination are shown in Tables 1 to 4, in which samples having a bonding defect are marked by the symbol ●, samples having a void ratio exceeding 10% by volume but not having a bonding defect are marked by the symbol ◐, and samples having a void ratio equal to or less than 10% by volume are marked by the symbol ○.

Evaluation of Initial Joint Reliability

The chips and cards were stored in an inert atmosphere after manufacture. The quality of their joints produced by the bonding process described above was evaluated according to the aforementioned evaluation method.

Evaluation of Long-Term Joint Reliability

The aforementioned chips were held in a test chamber set to a temperature of 85° C. and a relative humidity of 85% for 24 hours and, then, joined to the individual cards by the bonding process described above to produce test samples. Subsequently, their joint quality was evaluated according to the aforementioned evaluation method.

Evaluation of the Magnitude of Warpage

Entire surfaces of the samples produced by joining the Si chips to the Cu cards were observed by a laser microscope to examine their surface corrugations and the magnitude of corrugations was classified into three grades by relative evaluation.

Results of examination are shown in Table 4, in which the magnitude of warpage of samples having corrugations of which seriousness is equal to or smaller than that of samples joined by using currently available eutectic solder (Sn-37Pb) is evaluated as "small," the magnitude of warpage of samples having corrugations of which seriousness is greater than that of the samples joined by using the currently available eutectic solder but smaller than that of samples joined by using Sn-3.5Ag solder of which lowest eutectic temperature is 221° C. is evaluated as "medium," and the magnitude of warpage of samples having corrugations of which seriousness is equal to or greater than that of the samples joined by using the Sn-3.5Ag solder only is evaluated as "large."

Examples 1–15, Comparative Examples 1–23

The inventors produced Cu chips (Examples 1–15) having metal electrodes of the invention including the first layer 21 and the second layer 22 formed by electroplating substances shown in Table 1. The inventors also produced Cu chips (Comparative Examples 1–23) having metal electrodes formed by electroplating substances shown in Table 1 instead of the metal electrodes of the invention. Ten pieces each of these Examples 1–15 and Comparative Examples 1–23 were individually joined to Cu cards of the aforementioned configuration and subjected to tests for evaluating their initial joint reliability and long-term joint reliability.

In Table 1, a number placed immediately before a chemical symbol represents the content of the relevant element in the first or second layer 21, 22 in terms of percentage by weight. If the chemical symbol is not preceded by any number, the relevant element takes up the remainder of the content(s) of other element(s). Specifically, "Sn-37Pb" shown for the second layer 22 of Comparative Example 1 indicates that the second layer 22 contains 37% by weight of lead (Pb) and 63% (=100%-37%) by weight of Sn. Accordingly, the expression Sn-37Pb is identical to 63Sn-37Pb.

Solidus and liquidus temperatures shown in Table 1 are measurements taken on pure metals (tin and indium) and solder of specific compositions by use of a differential thermometer. Specifically, approximately 10 mg each of the pure metals and solder was heated and cooled at temperature increase and decrease rates of 5° C. per minute making the measurements. Here, the lowest temperature of a first appearing peak during heating is defined as the solidus temperature and the highest temperature of a first appearing peak during cooling is defined as the liquidus temperature.

Each of the Cu chips was placed at an approximately central part of the Cu card to which a flux had been applied. They were first heated at 120° C. on a hot plate for 30 seconds, and then at 180° C. for 30 seconds on the hot plate to join their metal electrodes to the Cu cards. The initial joint reliability and long-term joint reliability of individual specimens (Examples and Comparative Examples) were evaluated. In carrying out this evaluation test, 10 specimens each of the Cu chips (Examples and Comparative Examples) of the same structure and the aforementioned Cu cards were used. Results of evaluation of their joint quality are shown in Table 1.

TABLE 1

|  | 2nd Layer Composition, Thickness (μm) & Solidus-Liquidus Temperatures (° C.) | 1st Layer Composition, Thickness (μm) & Solidus-Liquidus Temperatures (° C.) | Initial joint reliability | Long-term joint reliability |
| --- | --- | --- | --- | --- |
| Comparative example 1 | Sn-37Pb 150 (183–183) | Nil | ● | ● |
| Comparative example 2 | Sn-37Pb 100 (183–183) | In 50 | ◐ | ● |
| Example 1 | In 150 (156–156) | Sn-37Pb 150 | ○ | ○ |
| Comparative example 3 | Sn-3.5Ag 150 (221–221) | Nil | ● | ● |
| Comparative example 4 | Sn-3.5Ag 100 (221–221) | In 50 (156–156) | ◐ | ● |
| Example 2 | In 50 (156–156) | Sn-3.5Ag 100 (221–221) | ○ | ○ |
| Comparative example 5 | Sn 150 (232–232) | Nil | ● | ● |
| Comparative example 6 | Sn 100 (232–232) | Sn-48Bi 50 (138–152) | ◐ | ● |
| Example 3 | Sn-48Bi 50 (138–152) | Sn 100 (232–232) | ○ | ○ |
| Comparative example 7 | Sn-3Ag-0.5Cu 150 (217–219) | Nil | ● | ● |
| Comparative example 8 | Sn-3Ag-0.5Cu 100 (217–219) | In 50 (156–156) | ◐ | ● |
| Example 4 | In 50 (156–156) | Sn-3Ag-0.5Cu 100 (217–219) | ○ | ○ |
| Comparative example 9 | Sn-3Ag-0.5Cu 150 (217–219) | Nil | ● | ● |
| Comparative example 10 | Sn-3Ag-0.5Cu 100 (217–219) | Sn-49In 50 (120–125) | ◐ | ● |
| Example 5 | Sn-49In 50 (120–125) | Sn-3Ag-0.5Cu 100 (217–219) | ○ | ○ |
| Comparative example 11 | Sn-3Ag-0.5Cu 150 (217–219) | Nil | ● | ● |
| Comparative example 12 | Sn-3Ag-0.5Cu 100 (217–219) | Sn-48Bi 50 (138–152) | ◐ | ● |
| Example 6 | Sn-48Bi 50 (138–152) | Sn-3Ag-0.5Cu 100 (217–219) | ○ | ○ |
| Comparative example 13 | Sn-3Ag-0.5Cu 100 (217–219) | In 50 (156–156) | ◐ | ● |
| Example 7 | In 50 (156–156) | Sn-3Ag-0.5Cu 100 (217–219) | ○ | ○ |
| Comparative example 14 | Sn-1Ag-0.5Cu 150 (217–227) | Nil | ● | ● |
| Comparative example 15 | Sn-1Ag-0.5Cu 100 (217–227) | In 50 (156–156) | ◐ | ● |
| Example 8 | In 50 (156–156) | Sn-1Ag-0.5Cu 100 (217–227) | ○ | ○ |
| Comparative example 16 | Sn-4Ag-1Cu 150 (217–228) | Nil | ● | ● |

TABLE 1-continued

| | 2nd Layer Composition, Thickness (μm) & Solidus-Liquidus Temperatures (° C.) | 1st Layer Composition, Thickness (μm) & Solidus-Liquidus Temperatures (° C.) | Initial joint reliability | Long-term joint reliability |
|---|---|---|---|---|
| Comparative example 17 | Sn-4Ag-1Cu 100 (217–227) | In 50 (156–156) | ◐ | ● |
| Example 9 | In 50 (156–156) | Sn-4Ag-1Cu 100 (217–227) | ○ | ○ |
| Comparative example 18 | Sn-4Ag-1Cu 100 (217–227) | Sn-45Bi 50 (138–165) | ◐ | ● |
| Example 10 | Sn-45Bi 50 (138–165) | Sn-4Ag-1Cu 100 (217–227) | ○ | ○ |
| Comparative example 19 | Sn-4Ag-1Cu 100 (217–227) | Sn-10In 50 (147–152) | ◐ | ● |
| Example 11 | Sn-10In 50 (147–152) | Sn-4Ag-1Cu 100 (217–227) | ○ | ○ |
| Comparative example 20 | Sn-4Ag-1Cu 100 (217–227) | Sn-20In 50 (140–145) | ◐ | ● |
| Example 12 | Sn-20In 50 (140–145) | Sn-4Ag-1Cu 100 (217–227) | ○ | ○ |
| Comparative example 21 | Sn-0.5Ag-0.2Cu 100 (220–229) | Sn-1Ag-1Cu-15In 50 (170–215) | ◐ | ● |
| Example 13 | Sn-1Ag-1Cu-15In 50 (170–215) | Sn-0.5Ag-0.2Cu 100 (220–229) | ○ | ○ |
| Comparative example 22 | Sn-3Ag-0.5Cu 100 (217–219) | Sn-3Ag-1Cu-10Bi 50 (180–210) | ◐ | ● |
| Example 14 | Sn-3Ag-1Cu-10Bi 50 (180–210) | Sn-3Ag-0.5Cu 100 (217–219) | ○ | ○ |
| Comparative example 23 | Sn-0.7Cu 100 (227–227) | In 50 (156–156) | ◐ | ● |
| Example 15 | In 50 (156–156) | Sn-0.7Cu 100 (227–227) | ○ | ○ |

As shown in Table 1, the outermost (bottommost) surfaces of the metal electrodes of the Cu chips are formed of Sn-37Pb solder of which melting point is 183° C. in Example 1 and Comparative Example 1, while the outermost (bottommost) surfaces of the metal electrodes of the Cu chips are formed of Sn-3.5Ag solder of which melting point is 221° C. in Example 2 and Comparative Example 3.

The Cu chips of Comparative Examples 1, 3, 5, 7, 9, 11, 14 and 16 can not be joined to the Cu cards because the aforementioned heating temperature of 180° C. is lower than the melting point (183° C.) of the outermost surfaces of their metal electrodes. In contrast, the Cu chips of Examples 1, 2, 4, 7, 8, 9 and 15, the second layer 22 of which metal electrodes is formed of In, can be joined to the Cu cards because the melting point of their first layer 21 lowers due to the occurrence of an eutectic reaction. Table 1 indicates that the initial joint reliability of the Cu chips of Comparative Examples 2, 4, 8, 13, 15, 17 and 23, the first layer 21 of which metal electrodes is formed of In, is inferior to that of the Cu chips of Examples 1, 2, 4, 7, 8, 9 and 15, the first layer 21 of which metal electrodes contains Sn as a principal constituent. It can also be seen from Table 1 that the long-term joint reliability of the Cu chips of Comparative Examples 2, 4, 8, 13, 15, 17 and 23 examined after the aforementioned damp heat cycle (85° C., 85% RH) is deteriorated compared to evaluation results of their initial joint reliability.

The metal electrodes of Examples 5, 11, 12 and 13 were formed in the aforementioned fashion using indium-containing alloys, such as Sn—In and Sn—Ag—Cu—In, instead of using In alone in the second layer 22. From comparisons of evaluation results between Example 5 and Comparative Example 10, between Example 11 and Comparative Example 19, between Example 12 and Comparative Example 20, and between Example 13 and Comparative Example 21, it has been understood that the indium-containing alloys used in the second layer 22 offered joint properties similar to those of the foregoing-embodiments. It can be easily presumed that other alloys, such as Bi—In and Sn—Bi—In, used in the second layer 22 would produce the same advantageous effect.

Likewise, the metal electrodes of Examples 3, 6, 10 and 14 were formed using bismuth-containing alloys, such as Sn—Bi and Sn—Ag—Cu—Bi, instead of using. In alone in the second layer 22. Comparisons of evaluation results between Example 3 and Comparative Example 6, between Example 6 and Comparative Example 12, between Example 10 and Comparative Example 18, and between Example 14 and Comparative Example 22 have also indicated that the bismuth-containing alloys used in the second layer 22 offered joint properties similar to those of the foregoing embodiments.

Although the use of In alone in the second layer 22 of the metal electrodes of the embodiments of the invention is effective for joining the metal electrodes under low-load conditions, it becomes easier to regulate the remelting temperature and mechanical properties of a joint if the second layer 22 of the metal electrode is made of an alloy of multiple kinds of metals. In addition, if the metal electrode contains the same metal as is contained in the joint surface of the circuit card, it is possible to suppress diffusion of that metal into the joint. This feature offers such an advantageous effect that it is possible to suppress diffusion of the metal in the joint surface by selectively containing the relevant metal in the second layer 22.

It is recognized from the foregoing discussion that, in joining a metal electrode to the Cu card while removing a oxide film by use of flux in a low-temperature bonding process performed with the provision of a layer containing a substance which produces an eutectic reaction with Sn, the electrode structure of the invention of which first layer 21 containing Sn as a principal constituent had a higher melting point than the second layer 22 exhibited an effect of improving the initial joint reliability and long-term joint reliability.

The same advantageous effect is obtained even when the film thickness of the metal electrode is varied in the foregoing embodiments, or when the individual metallic layers are formed by such an alternative process as spattering, evaporation or dipping.

Examples 16–24, Comparative Examples 24–32

The inventors produced Cu chips (Examples 16–24) having metal electrodes of the invention as well as comparative Cu chips (Comparative Examples 24–32) having metal electrodes. The first and second layers 21, 22 of the metal electrodes were formed by electroplating specific substances to specific thicknesses shown in Table 2. Ten pieces each of these Examples 16–24 and Comparative Examples 24–32 were individually joined to Cu cards of the aforementioned configuration and subjected to tests for evaluating their initial joint reliability and long-term joint reliability.

Each of the Cu chips was placed at an approximately central part of the Cu card to which a resin containing a reducing material had been applied instead of the flux. Then, while applying a load of 50 gf from top by use of a push gage, the Cu chips were heated at 200° C. for 30 seconds on a hot plate to join their metal electrodes to the Cu cards. The initial joint reliability and long-term joint reliability of the individual Examples were evaluated, and the results are shown in Table 2.

TABLE 2

| | 2nd Layer Composition, Thickness (μm) & Solidus-Liquidus Temperatures (° C.) | 1st Layer Composition, Thickness (μm) & Solidus-Liquidus Temperatures (° C.) | Initial joint reliability | Long-term joint reliability |
|---|---|---|---|---|
| Comparative example 24 | Sn<br>100<br>(232–232) | Sn-3Bi<br>50<br>(225–229) | ● | ● |
| Example 16 | Sn-3Bi<br>50<br>(225–229) | Sn<br>100<br>(232–232) | ○ | ○ |
| Comparative example 25 | Sn<br>200<br>(232–232) | In<br>50<br>(156–156) | ◐ | ● |
| Example 17 | In<br>50<br>(156–156) | Sn<br>200<br>(232–232) | ○ | ○ |
| Example 18 | In<br>70<br>(156–156) | Sn-33Pb<br>100<br>(183–245) | ○ | ○ |
| Comparative example 26 | Sn-33Pb<br>100<br>(183–189) | In<br>70<br>(156–156) | ◐ | ● |
| Comparative example 27 | Sn-3.0Ag-0.5Cu<br>100<br>(217–219) | Sn-49Bi<br>65<br>(138–152) | ◐ | ● |
| Example 19 | Sn-49Bi<br>65<br>(138–152) | Sn-3.0Ag-0.5Cu<br>100<br>(217–219) | ○ | ○ |
| Comparative example 28 | Sn-1.0Ag-0.5Cu<br>150<br>(217–227) | Sn-49In<br>100<br>(120–125) | ◐ | ● |
| Example 20 | Sn-49In<br>100<br>(120–125) | Sn-1.0Ag-0.5Cu<br>150<br>(217–227) | ○ | ○ |
| Comparative example 29 | Sn-3.5Ag<br>150<br>(221–221) | Sn-20Bi-20In<br>70<br>(130–185) | ◐ | ● |
| Example 21 | Sn-20Bi-20In<br>70<br>(130–185) | Sn-3.5Ag<br>150<br>(221–221) | ○ | ○ |

TABLE 2-continued

|  | 2nd Layer Composition, Thickness (μm) & Solidus-Liquidus Temperatures (° C.) | 1st Layer Composition, Thickness (μm) & Solidus-Liquidus Temperatures (° C.) | Initial joint reliability | Long-term joint reliability |
|---|---|---|---|---|
| Comparative example 30 | Sn-3.8Ag-1.1Cu-0.5Co 150 (217–227) | In 50 (156–156) | ◐ | ● |
| Example 22 | In 50 (156–156) | Sn-3.8Ag-1.1Cu-0.5Co 150 (217–227) | ○ | ○ |
| Comparative example 31 | Sn-0.5Ag-0.2Cu 150 (220–229) | Sn-30In 100 (130–133) | ◐ | ● |
| Example 23 | Sn-30In 100 (130–133) | Sn-0.5Ag-0.2Cu 150 (220–229) | ○ | ○ |
| Comparative example 32 | Sn-10Au 150 (217–217) | In 100 (156–156) | ◐ | ● |
| Example 24 | In 100 (156–156) | Sn-10Au 150 (217–217) | ○ | ○ |

Table 2 indicates that there is the same relationship between the evaluation results of Examples 16–24 and Comparative Examples 24–32 obtained when the metal electrodes are joined to the Cu cards by using resin containing a reducing material while applying a load as between the evaluation results of Examples 1–15 and Comparative Examples 1–23 shown in Table 1.

This means that even when the first layer 21 and the second layer 22 entirely melt and form together a uniform composition, the initial joint reliability and long-term joint reliability are improved by the electrode structure of the invention of which first layer 21 contains Sn as a principal constituent and has a higher melting point than the second layer 22.

It can be easily presumed that the same advantageous effect will be obtained even when the individual layers of the metal electrode are formed of alloys.

If the remelting temperature of a joint obtained from the metal electrode of the invention is too low, the joint reliability tends to deteriorate due to remelting of the joint caused by heat generation in an active device or a rise in ambient temperature. It is therefore desirable that the concentration of In in the joint be equal to or lower than 10% by weight of the concentration of Sn.

Similarly, it is desirable that the concentration of Bi in the joint be equal to or lower than 3% by weight of the concentration of Sn and the joint contain no toxic substances such as lead (Pb), cadmium (Cd) and mercury (Hg).

Examples 25–30

Metal electrodes A to F shown in Table 3 below were formed, each of the metal electrodes including first and second layers 21, 22 to produce Si chips having the same structure according to the embodiment as shown in FIGS. 1A and 1B. The first and second layers 21, 22 were formed by electroplating processes. The thicknesses of the first and second layers 21, 22 of the metal electrodes A-F, totaling 100 μm, were determined such that their eutectic compositions formed after melting would be Sn-0.7Cu (Example 25), Sn-3.5Ag (Example 26), 90Sn-10Au (Example 27), Sn-37Pb (Example 28), Sn-58Bi (Example 29) and Sn-49In (Example 30), respectively. Ten pieces each of these Si chips were produced.

TABLE 3

|  | 2nd layer (solidus-liquidus) | 1st layer (solidus-liquidus) | Elements of lowest eutectic reaction | Lowest eutectic temperature |
|---|---|---|---|---|
| A | Sn (232° C.) | Sn-40Cu (415° C.) | Cu—Sn | 227° C. |
| B | Sn (232° C.) | Sn-48Ag (221° C.–480° C.) | Sn—Ag | 221° C. |
| C | Sn (232° C.) | Sn-49Au (309° C.–380° C.) | Au—Sn | 217° C. |
| D | Sn-10Pb | Sn (232° C.) | Sn—Pb | 183° C. |
| E | Sn-80Bi (138° C.–200° C.) | Sn-3Bi (225° C.–228° C.) | Sn—Bi | 138° C. |
| F | In (158° C.) | Sn (232° C.) | Sn—In | 120° C. |

Each of the Cu chips was placed at an approximately central part of a Cu card to which a flux had been applied. Then, the Cu chips were heated at 230° C. or 250° C. for 30 seconds on a hot plate and their metal electrodes were joined to the Cu cards as heat was dissipated into the atmosphere.

The magnitude of warpage of these samples was evaluated and classified into three grades of warpage seriousness according to the aforementioned evaluation criteria. Table 4 below shows the results of evaluation of the magnitude of warpage as well as the results of joint quality evaluation. The ten samples of the Cu chips joined to the Cu cards of each Example (25–30) having the same metal electrode structure exhibited the same results of joint quality evaluation as shown in Table 4.

TABLE 4

| Joining temp. | | Ex. 25 | Ex. 26 | Ex. 27 | Ex. 28 | Ex. 29 | Ex. 30 |
|---|---|---|---|---|---|---|---|
| | | \multicolumn{6}{c}{Solder composition} | | | | | |
| | | A | B | C | D | E | F |
| 230° C. | Warpage | Large | Medium | Small | Small | Small | Small |
| | Joint quality | ◐ | ○ | ○ | ○ | ○ | ○ |
| | Flux burn | No | No | No | No | No | No |
| 250° C. | Warpage | Large | Medium | Small | Small | Small | Small |
| | Joint quality | ○ | ○ | ○ | ○ | ○ | ○ |
| | Flux burn | Yes | Yes | Yes | Yes | Yes | Yes |

It is recognized from Table 4 that the magnitude of warpage which occurs when a Si chip and a circuit card having different coefficients of thermal expansion are joined depends essentially on the melting point of their joint. Specifically, the magnitude of warpage is small if the melting point of the joint is low, so that their bonding temperature should preferably be as low as possible.

In a case where an electrode has a lamellar structure, a portion of the electrode which melts at a heating temperature forms a joint. Since this heating temperature corresponds approximately to the melting point of solder, the temperature at which the first and second layers 21, 22 begin to melt, or the lowest temperature at which an eutectic reaction occurs between the first and second layers 21, 22, should preferably be equal to or lower than 221° C. It is more preferable that the lowest temperature at which an eutectic reaction occurs between the first and second layers 21, 22 be equal to or lower than 183° C. which is the melting point of the currently available eutectic solder.

It is also noted from Table 4 that the flux becomes scorched at a heating temperature of 250° C. The residue of the scorched flux can not be washed out, and because the scorched flux residue contains chlorine ions, there is a risk of deterioration of insulation quality under high-temperature, high-humidity conditions. Accordingly, the hot plate should preferably be set to a temperature of 230° C. or less when using a flux.

Furthermore, Table 4 indicates that the aforementioned metal electrodes A–F of which melting point after bonding is 221° C. can be joined to the circuit card at 230° C. or less with good joint quality without producing large warpage. This indicates that the above-described method of joining the metal electrode of the invention is suited to joining electronic components.

The aforementioned flux burn problem becomes more serious when using a resin containing a reducing material. Generally available polymers become scorched at temperatures far exceeding 200° C. Therefore, the bonding temperature should preferably be as low as possible from this point of view as well.

Although the metal electrode can be joined without performing the aforementioned oxide film removing process, it is desirable that the metal electrode be joined at as low temperatures as possible for reducing warpage and ensuring good joint quality.

Example 31

The inventors produced metal electrodes according to the invention by depositing a 35 μm thick Ni—P layer, a 0.05 μm thick Au layer, a 3 μm thick Cu layer, a 0.05 μm thick In layer and a 2 μm thick Sn layer in this order on an Al wiring layer of a TEG wafer by electroless plating in a manner similar to the embodiment shown in FIG. 3. The inventors also produced Sn bumps (electrodes) aiming at a height of 40 μm on an Al wiring layer of a TEG wafer of the same type as described above by electroplating. The TEG wafers were diced and chip samples were taken from central and peripheral portions of the wafers.

The height of the electrode formed on each chip sample was measured. Measurements obviously indicated that variations in electrode height were smaller on the electrodes formed by electroless plating than on the electrodes formed by electroplating and the initial joint reliability of the electrodes formed by electroless plating was superior to the initial joint reliability of those formed by electroplating.

Example 32

The inventors produced TEG chips each having metal electrodes formed by depositing a 5 μm thick Ni layer, a 30 μm thick In layer and a 35 μm thick Sn layer in this order on a Cu wiring layer by electroplating such that the electrodes were arranged at 180 μm intervals on a pattern and the individual electrodes measured 70 μm high and 70 μm in diameter. The inventors also produced TEG cards each having a Cu wiring layer. The Cu wiring layer was coated with a resist (solder mask), openings measuring 85 μm in diameter were formed in the resist coating, and the TEG cards were dipped in a bath of Sn-3.5Ag solder to form solder bumps in the openings. The height of bumping was adjusted to approximately 50 μm.

The TEG chip was aligned with the TEG card by use of a flip chip bonder and, while scrubbing their electrodes and solder bumps each other to break up oxide films on solder surfaces by mechanical action, the TEG chip and the TEG card were joined at bonding temperatures of 190° C. and 240° C. without using a flux under a load of 20 gf. Ten pieces each of such test samples were produced at the respective bonding temperatures.

Examination of these samples performed by using an X-ray microscope has revealed that the samples joined at 190° C. were all satisfactory, whereas the samples joined at 240° C. which was higher than the melting point of Sn had short circuits between adjacent bumps here and there caused by solder bridging.

From this, it is understood that chips carrying finely pitched electrodes have an increased risk of solder bridging when heated at temperatures equal to or higher than the melting point of the first layer 21.

When the TEG chip was joined to the TEG card at a bonding temperature of 240° C. with a resin containing a reducing material applied to the electrode surface but without scrubbing, many voids presumably caused by mixing of the resin were observed in joint areas.

Example 33, Comparative Examples 33, 34

Figure 4:
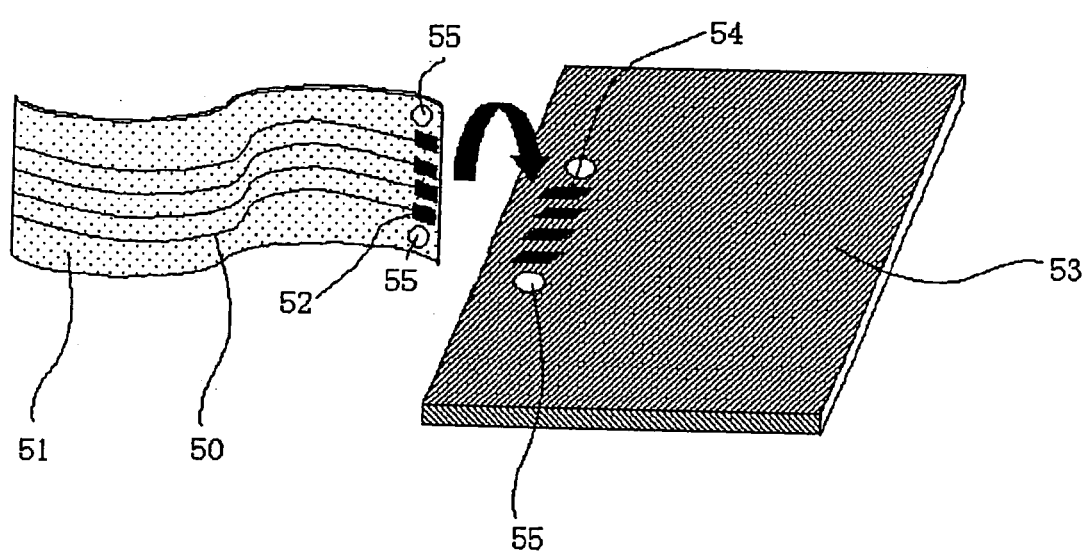
FIG. 4 is a perspective diagram showing how metal electrodes of the invention formed on a film substrate are bonded.

A wiring pattern 50 was formed by electroplating copper on a substrate 51 made of a polyimide film, the wiring pattern 50 including copper wires measuring 150 μm square each in cross section and arranged parallel to one another at 0.3 mm intervals, as shown in FIG. 4. Electronic components (flexible circuits) were produced by forming metal electrodes 52 having the same structures as the foregoing Example 4, Comparative Example 7 and Comparative Example 8 at ends of the copper wires on multiple substrates 51 each carrying the wiring pattern 50. These specimens (electronic components) having the metal electrodes 52 according to Example 4, Comparative Example 7 and Comparative Example 8 are hereinafter referred to as Example 33, Comparative Example 33 and Comparative Example 34, respectively.

Circuit cards each including a carrier base made of a glass epoxy board 53 and a copper wire pattern corresponding to the wiring pattern 50 formed on the substrate 51 were prepared for carrying the electronic components. Electrodes 54 which would serve as joint surfaces were made on the copper wire pattern on each of the glass epoxy boards 53 by depositing a 5 μm thick Ni—P layer by electroless plating, and a 0.05 μm thick Au layer on the Ni—P layer.

Ten pieces each of the aforementioned electronic components (Example 33, Comparative Examples 33, 34) were bonded to the individual circuit cards by using a pulse heater having a capability of controlling applied load and temperature.

The metal electrodes 52 of the electronic components were aligned with the electrodes 54 of the circuit cards by passing positioning pins at a pulse heater stage through holes 55 formed in each circuit card.

Joint portions of the metal electrodes 52 and the electrodes 54 were heated at a temperature of 200° C. while applying a load of 100 gf for 10 seconds, and results of this bonding process were evaluated with respect to initial joint reliability and long-term joint reliability. The metal electrodes 52 of the electronic components of Comparative Example 33 could not be joined to the electrodes 54 of the circuit cards because the heating temperature of 200° C. was lower than the melting point of the outermost layer of the metal electrode 52 like Example 4, Comparative Example 7 and Comparative Example 8. Contrary to this, the metal electrodes 52 of the electronic components of Example 33 including In in the second layer 22 could be joined to the electrodes 54 of the circuit cards because the melting point of their first layer 21 lowered due to the occurrence of an eutectic reaction. Although the metal electrodes 52 of the electronic components of Comparative Example 34 containing In in the first layer 21 could be joined to the electrodes 54 of the circuit cards, their initial joint reliability was inferior to that of Example 33 containing Sn as a principal constituent of solder in the first layer 21 and their long-term joint reliability under high-temperature, high-humidity conditions further deteriorated compared to the initial joint reliability.

Experiments similar to what were performed on Example 33, Comparative Example 33 and Comparative Example 34 discussed above were conducted by using the metal electrodes of Examples 1–15 and Comparative Examples 1–23. Results of these experiments indicated the same tendency as described above.

Furthermore, experiments similar to what were discussed above were carried out, in which joint portions of the metal electrodes 52 and the electrodes 54 were heated at a temperature of 240° C. while applying a load of 100 gf for 10 seconds. Specimens obtained in these experiments were inspected for any electrode misalignment by using an optical microscope. As a general tendency, all of the specimens obtained with the heating temperature of 240° C. exhibited greater electrode misalignment compared to those obtained with the heating temperature of 200° C.

It can be easily presumed that higher joint reliability is obtained as the heating temperature is decreased.

What is claimed is:

1. A method of joining a metal electrode to a circuit card having a joining surface of a material which diffuses with tin when heated, comprising:

forming a metal electrode comprising multiple metallic layers disposed on a substrate and including at least a first layer and a second layer, wherein the first layer is the metallic layer most remote from the substrate, includes an outermost surface of the metal electrode, and contains tin as a principal constituent, the second layer is in contact with the first layer and contains a metallic element which produces a eutectic reaction with tin, and the melting point of the first layer is higher than the melting point of the second layer;

forming a circuit card by depositing a wiring layer on a base, the wiring layer having a joining surface of a material which diffuses with tin when heated;

bringing the first layer of the metal electrode into contact with the joining surface of the wiring layer of the circuit card; and heating the metal electrode to a temperature at least equal to the lowest temperature at which a eutectic reaction occurs between the first and second layers, but lower than the melting point of the first layer, to join the metal electrode to the circuit card.

\* \* \* \* \*